United States Patent [19]
Kratzmair

[11] 4,400,629
[45] Aug. 23, 1983

[54] DELTA-STAR CONNECTION

[75] Inventor: Ernst Kratzmair, Munich, Fed. Rep. of Germany

[73] Assignee: Schaltbau Gesellschaft mbH, Munich, Fed. Rep. of Germany

[21] Appl. No.: 394,632

[22] Filed: Jul. 2, 1982

Related U.S. Application Data

[63] Continuation-in-part of Ser. No. 288,814, Jul. 31, 1981, abandoned.

[51] Int. Cl.³ .................................................. H02B 1/24
[52] U.S. Cl. ................................................... 307/127
[58] Field of Search ................... 307/13, 18, 113, 127, 307/139, 140

[56] References Cited

U.S. PATENT DOCUMENTS

| | | | |
|---|---|---|---|
| 3,497,796 | 2/1970 | Konrad | 307/127 X |
| 3,559,042 | 1/1971 | Gingell | 307/127 X |
| 3,716,718 | 2/1973 | Nowell | 307/13 |
| 4,336,485 | 6/1982 | Stroud | 307/18 X |

*Primary Examiner*—Michael L. Gellner
*Assistant Examiner*—Derek Jennings
*Attorney, Agent, or Firm*—Ralf H. Siegemund

[57] ABSTRACT

A three-phase circuit, either load impedances or transformer windings for feeding such load impedances, are connected in a delta circuit configuration by a first group of controllable semiconductor elements and in a star circuit configuration by a second group of such elements. All elements are fired, but at different phase angles for operatively establishing a star, a delta, or a mixed type of connection.

7 Claims, 19 Drawing Figures

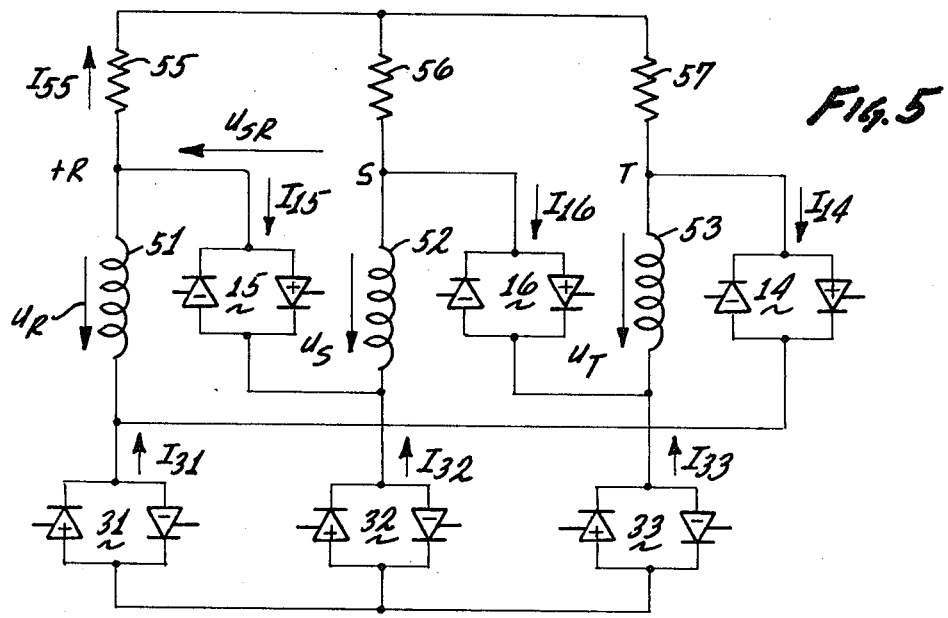
Fig.5
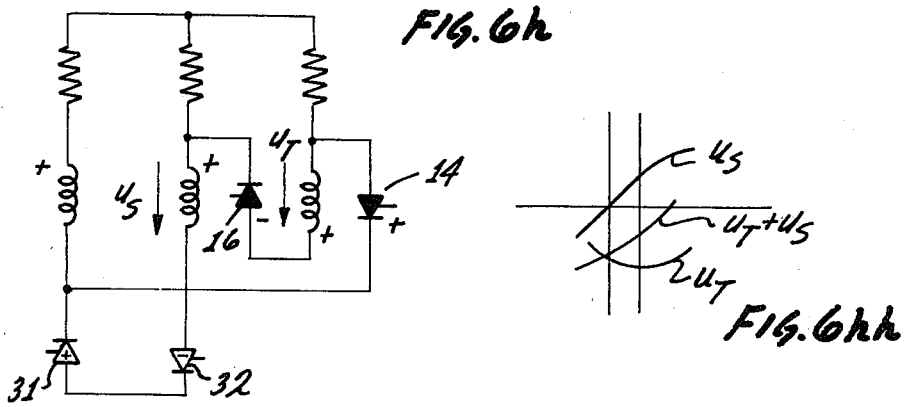
Fig.6h
Fig.6hh
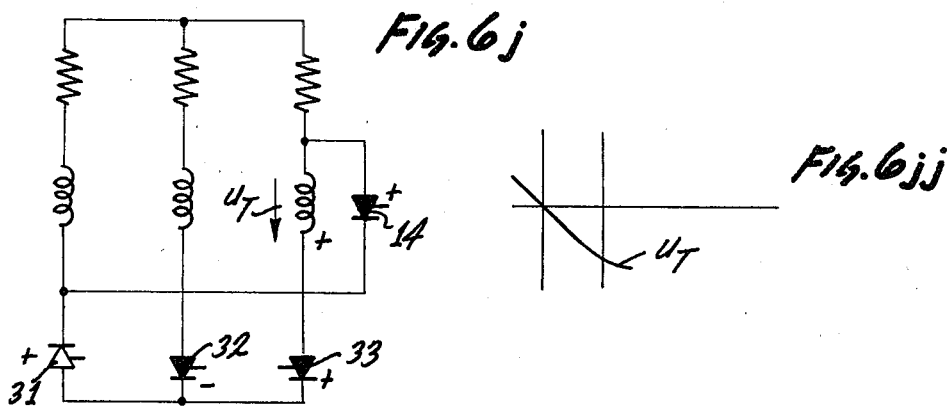
Fig.6j
Fig.6jj

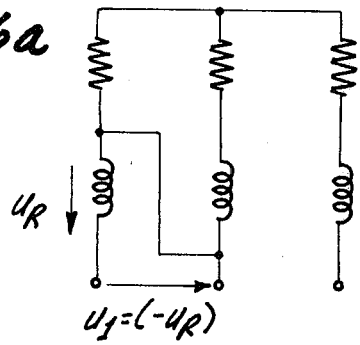
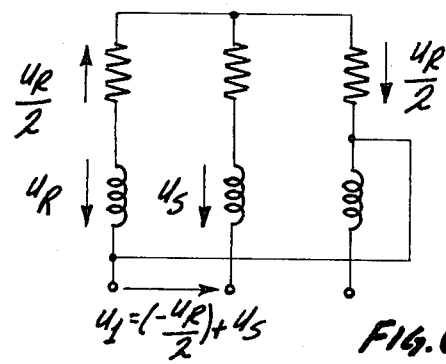
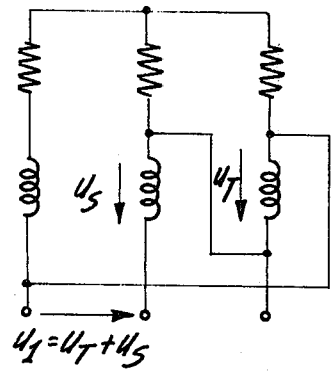
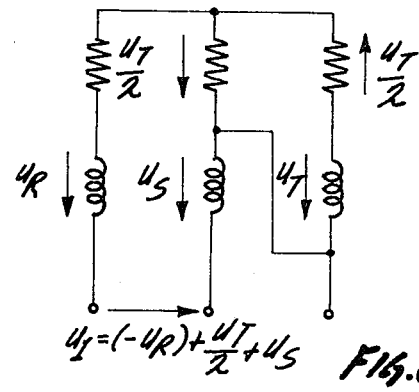
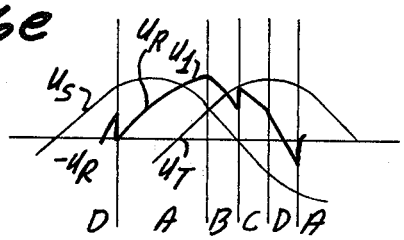
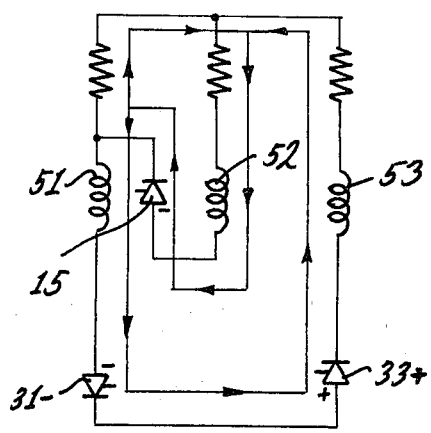
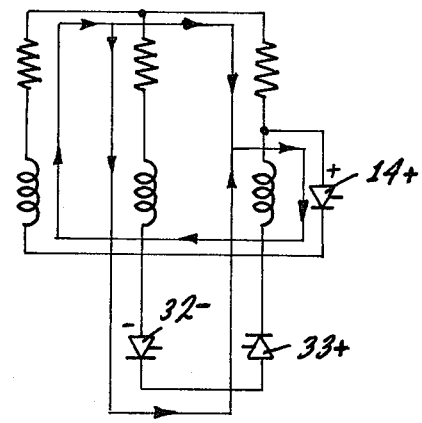

DELTA-STAR CONNECTION

BACKGROUND OF THE INVENTION

This is a continuation in part of application Ser. No. (288,814), filed July 31, 1981 abandoned.

The present invention relates to the conversion or change of a three-phase circuit from a star circuit configuration to a delta circuit configuration and vice versa.

It is generally known to switch from star to delta circuits and vice versa by means of electromagnetic switches, circuit breakers, or the like, or by means of thyristores or triacs. None of these known circuits, however, provides for a continuous transition; all of these known circuits thus produce current and/or voltage jumps either on the load or in the power supply. Accordingly, the known circuits do not provide for an intermediate state which is a combination of delta and star circuit connection.

DESCRIPTION OF THE INVENTION

It is an object of the present invention to provide a new and improved circuit by means of which three-phase circuits can be interconnected in the delta as well as in the star circuit configuration, the transition being such that voltage and/or current jumps will be avoided.

It is another object of the present invention to provide a mixed star-delta circuit connection.

It is a further object of the present invention to operate three-phase circuits in the delta and star circuit configuration and, possibly, in an in between and composite, combined or mixed circuit configuration.

In accordance with the preferred embodiment of the invention, it is suggested to provide two groups of the semiconductor elements, one for establishing a star circuit connection of load elements or tranformer windings, the other group for establishing a delta circuit connection thereof, and to control each group so that semiconductor elements in one group are always fully (or almost fully) conductive, in a forward direction, throughout the respective half-wave for which they can conduct, while the semiconductor elements in the other group are fired with a delay action to be conductive through a portion of each respective half-wave as respectively applied.

Any transition is carried out by delaying firing of the one group more and of the other group less, gradually, until the final, new state has been obtained. This process permits any such intermediate state to be actually a final state. The contemplated gradual change from wave to wave is free of voltage transients and jumps on the load.

Without intending to limit the application of the invention, a three-phase circuit may include three load impedances, or three secondary windings of a three-phase voltage supply transformer, or three primary windings of a three-phase load transformer.

The application of the invention permits changing the voltage on the load by a factor lower or higher than $\sqrt{3}$ so that the field of application is enlarged accordingly. For instance, in the case of applying the invention to the secondary windings of a voltage supply transformer, the delta circuit group of semiconductor elements may be connected to taps on these secondaries, while the star circuit group of semiconductor elements are connected to the full secondary (or higher taps). The maximum voltages for the two types of configuration will differ in this case by a factor higher than $\sqrt{3}$. If the connector of the groups of semiconductor elements is reversed, the factor is smaller than $\sqrt{3}$. The situation is analogous if applied to the primaries of a load transformer.

Among other advantages, it should be noted that the invention permits a reduction in the voltage on the load from a maximum value to a reduction by the factor $\sqrt{3}$ without suffering an unfavorable cosine $\phi$ distribution which is a well-known drawback of current inverter control for reducing the voltage.

Another advantage relates to a situation in which constant power is to be provided through a transformer, while in cases a change is needed from a high voltage and a low current to a low voltage and a high current. The transformer can now be designed without the need for high voltage-high current as is needed in the case of conventional current inverter control for the purpose of reducing the voltage.

A particular feature of the invention relates to connecting the star circuit group of semiconductor elements to the ends of transformer windings, and the delta circuit group is connected to taps, resulting in a reduced load voltage for this type of connection regardless whether the windings are secondaries or primaries. In the case of a power supply transformer, a higher, effective number of secondary windings leads to a higher power supply voltage. In the case of a load transformer, a lower, effective number of primary windings leads also to a higher load voltage.

DESCRIPTION OF THE DRAWINGS

While the specification concludes with claims, particularly pointing out and distinctly claiming the subject matter which is regarded as the invention, it is believed that the invention, the objects and features of the invention, and further objects, features and advantages thereof, will be better understood from the following description taken in connection with the accompanying drawings, in which:

FIG. 5 is a circuit diagram showing another example of the preferred embodiment for practicing the best mode thereof;

FIGS. 6a through 6j show different portions of the circuit of FIG. 5 with supplemental representations of current flow for the different situations (columns) as per FIG. 6.

Preceeding now to the detailed description of the drawings, FIG. 1 illustrates a three-phase network R, S and T, and a load composed of individual load resistances or impedances 11, 12, and 13. These loads are generally depicted as resistors; but it will be appreciated that these loads are impedances in the general sense and may thus include inductive and/or capacitive components to the extent the semiconductors employed permit such loads. The circuit includes additionally pairs 14, 15, and 16 of controllable power semiconductors, each pair being comprised of two semiconductor elements connected oppositely in parallel and being distinguished, rather arbitratily by (+) and (−).

Figure 1:
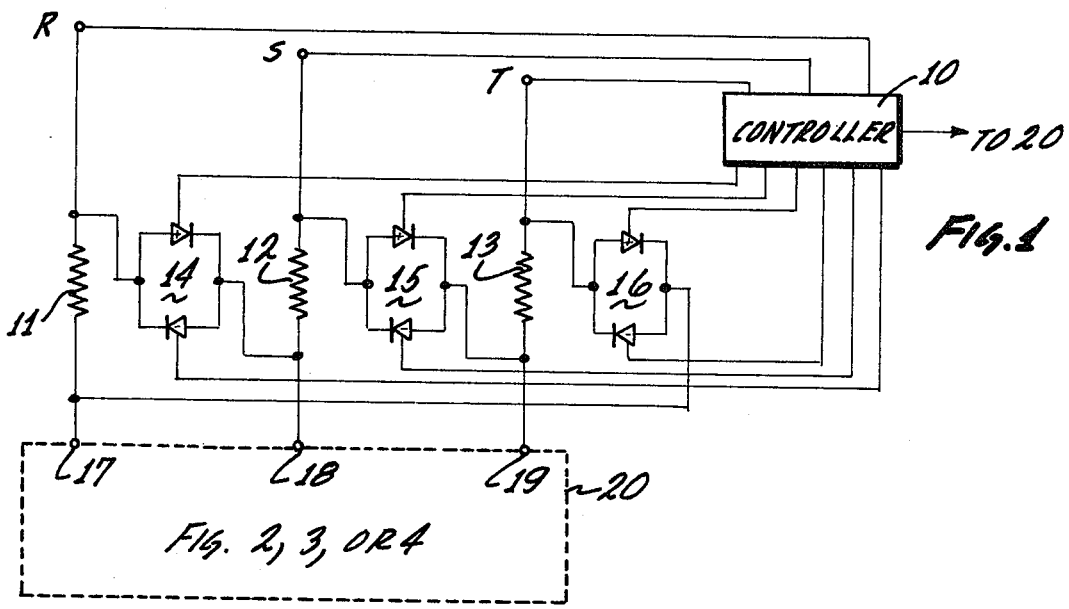
FIG. 1 is a circuit diagram showing an example of practicing the preferred embodiment of the invention in accordance with the best mode thereof.

The load impedances 11, 12, and 13 are respectively serially connected to the three phases R, S, and T of a power supply. The group of semiconductor elements is connected to these load impedances to complete a ring configuration. Upon rendering these elements fully conductive, they complete a delta circuit for and of the three load impedances. This group of semiconductor elements can, therefore, be called the "delta circuit group."

Reference numeral 10 denotes a control circuit, being connected to the R-S-T power supply primarily for the purpose of phase reference. This circuit 10 provides firing pulses to the semiconductor elements for rendering them conductive at desired instants. Firing will normally occur for a delta circuit connection right after a cross-over of respective two of the phases.

Figure 2:
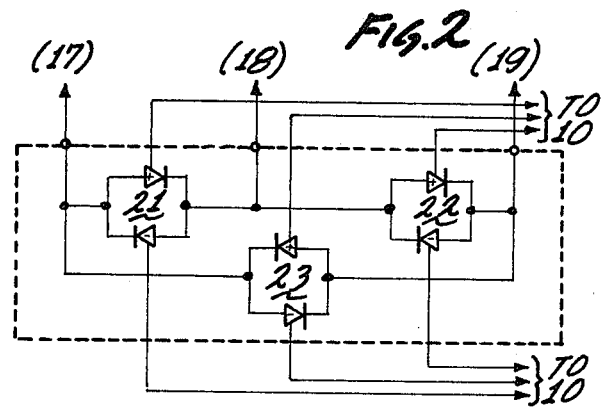
FIGS. 2, 3, and 4 are circuit diagrams, each for completing the circuit of FIG. 1, as indicated therein.
Figure 3:
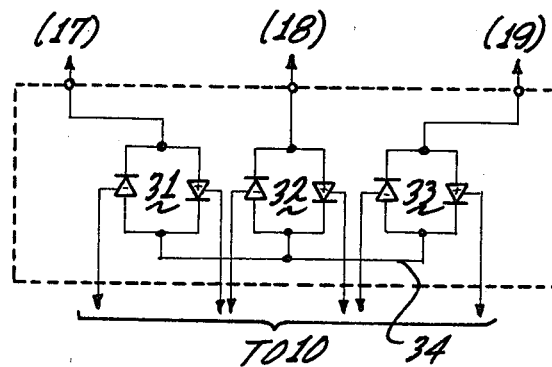
Figure 4:
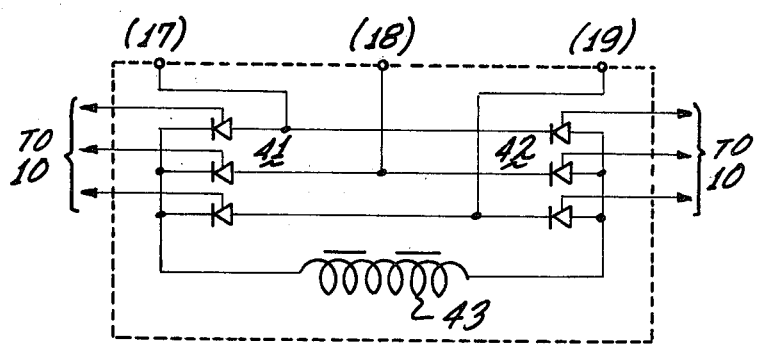

The circuit of FIG. 1 illustrates further three terminals 17, 18, and 19, leading to a circuit 20, and either one of the three circuits shown in FIGS. 2, 3, and 4 can be connected thereto. In other words, FIGS. 2, 3, and 4 are examples for circuit 20. These circuits include groups of semiconductor elements provided to complete a star circuit connection among the three loads 11, 12, and 13. This configuration, however can be effected in different ways. The control circuit 10 is connected to the respective star-completing circuit for firing the respective semiconductor elements.

The circuit shown in FIG. 2 illustrates a star circuit group of three pairs 21, 22, and 23 of controllable semiconductor elements which are themselves connected to the three phases in a delta circuit. Upon being rendered fully conductive, the star circuit group interconnects the three terminals 17, 18, and 19 directly and, thus, complete a star circuit for the loads in FIG. 1. This circuit may be used if the star point is to be kept floating.

FIG. 3 illustrates three pairs 31, 32, and 33 of controllable semiconductor elements, all elements being connected to a common terminal 34 they are thus themselves interconnected in a star circuit. It can readily be seen that this particular circuit permits ready connection of the star point to a reference potential such as ground.

FIG. 4 illustrates a different grouping of the altogether six semiconductor elements. Two groups 41 and 42 establish a three-phase, full-wave rectifier circuit whose d.c. output terminals are interconnected by an inductance 43.

As stated, the control provided by circuit 10 operates the respective semiconductor elements. The rule for control is such that all semiconductor elements participate at all times; the distinction between delta connection, star connection, and a mixed connection is made by a relative phase of firing. Any change is carried out by shifting the phase of firing so that the voltage across the respective loads is increased. This will be explained later with reference to FIG. 5.

FIG. 5 illustrates a slightly different connection, wherein particularly the three phases are applied to three ohmic loads 55, 56, and 57 via the secondaries 51, 52, and 53 of a three-phase transformer. The loads 55, 56, and 57 are all connected in a star circuit; but the secondaries are interconnected by the delta group of semiconductors 14, 15, and 16 and by the star group 31, 32, and 33 for a star circuit corresponding to FIG. 3. The figure shows also several currents (I) the subscripts denoting the particular element or elements through which such currents pass.

The voltage to be considered are those across the secondaries as well as between the connect points of the secondaries to the respective load resistances. The voltage $U_{SR}$ is an example of such an interphase voltage. The voltages $U_R$, $U_S$, and $U_T$ are, in particular, developed directly respectively across the secondaries, measured in each instance from the junction with the respective load to that end of the respective secondary which will be joined with others in the star point by operation of the star circuit group of semiconductors 31, 32, and 33.

Figure 6:
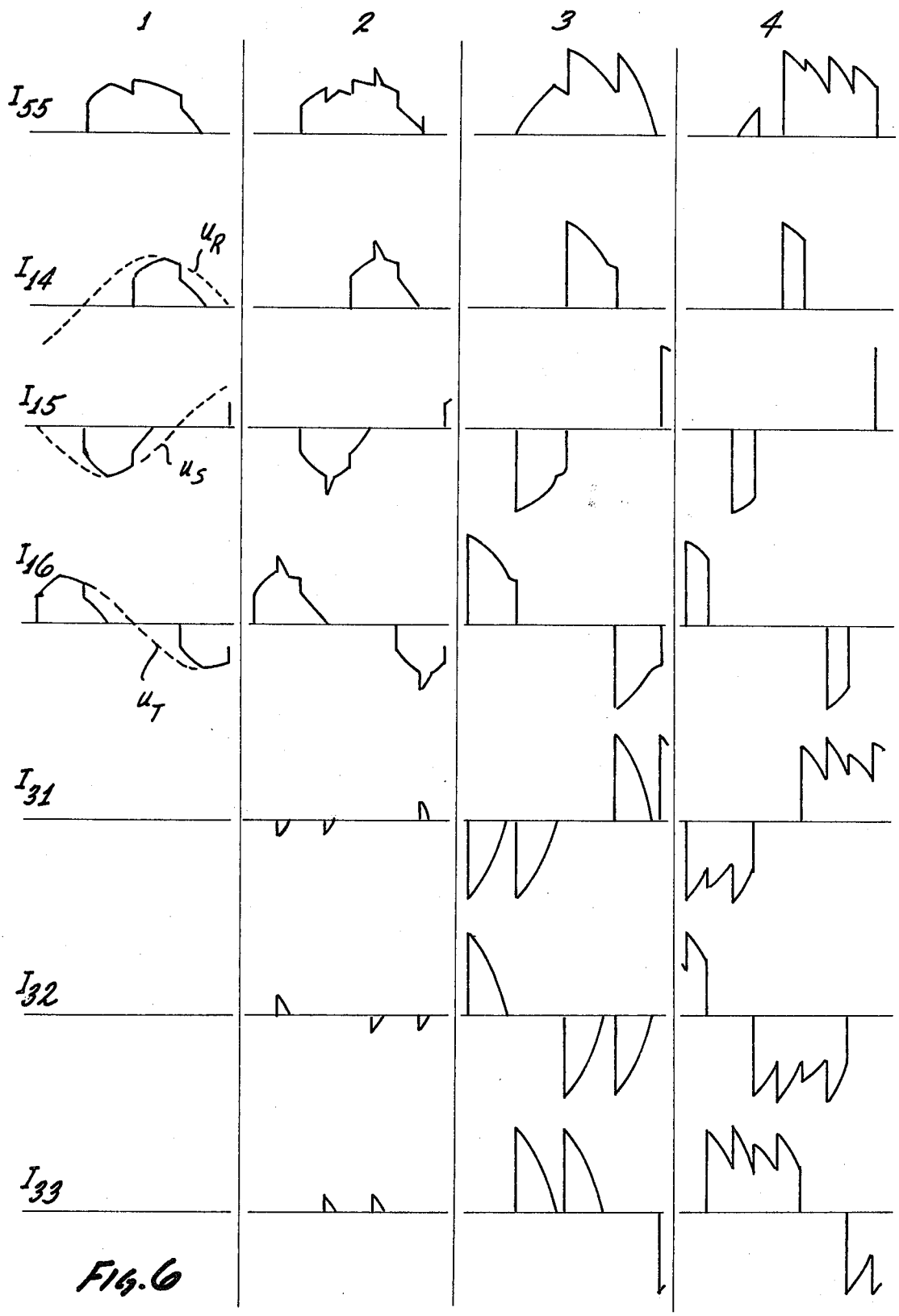
FIG. 6 is a matrix-like graph showing the current flow through several elements (matrix rows) as per the circuit shown in FIG. 5, and for different firing angles (matrix columns), sequential columns representing declining firing delays.

FIG. 6 is a table showing the wave form of the current through different circuit elements, identified along the lefthand margin. The wave forms are presented in different columns, wherein each column refers to a different firing angle for the star circuit group (31, 32, 33).

In accordance with the rule underlying the invention, all of the semiconductor elements participate in the operation; and star and delta connections are always established. The effective predominant connection is determined by relative phase angles of firing these elements. However, in order to simplify the description, column 1 denotes "pure" delta operations. The second, third, and fourth row show the current through the delta groups 14, 15, and 16, respectively, and it is presumed that no current flows through the star group. One of the load currents, namely the current through load 55 is depicted in column 1, row 1; and one can readily see that it is composed of superimposed segments of the currents through the delta groups 14, 15, and 16.

As far as the operation is concerned, consider voltage $U_R$ minus current $I_{14}$. Element 14+ is fired at a 60-degree delay from the zero-crossing of $U_R$. At that instant, current flows also through 15−, but not through any other element. At 90°, the R-wave current through 15− extinguishes; and for the next thirty degrees, the load current flows through 14+ only. At 120°, 16− is fired etc. It can readily be seen that the respective participating semiconductor elements of the delta group conduct a current for 90° of each half-wave, and there is a 30-degree overlap with any of two delta group elements that conduct current. The load current through 55 is accordingly a composite, as per the following: From 0° to 30° of the R-wave, the load current branches through the delta elements 15− and 16+; from 30° to 90°, the load current branches through 15− and 14+. From 90° to 120°, current flows only through 14+; and from 120° to 150°, the current flows through elements 14+ and 16− so that the positive half-wave of $I_{55}$ covers 150° of the positive R-wave ($U_R$). The situation is analogous for the other loads.

Since the delta elements are not fired right after the zero-crossing of the respective driving voltage, the driving voltage for star elements is not sinusoidal. This will be explained with reference to FIGS. 6a through 6e. The voltage considered is the one between two star group functions with the secondaries for $U_R$ and $U_S$; this voltage is denoted $U_1$. The positive half-wave of this particular voltage is capable of driving star elements 31− and 32+ if fired. That voltage $U_1$ is not sinusoidal.

One has to distinguish between four different zones or phase ranges. Range A (FIG. 6e) covers 0° to 90° of $U_R$ and $U_1$ coincides therewith (at reversed polarity, delta group 15−). In range B, from 90° to 120°, $U_1 = -U_{R/2} + U_S$ on account of the participation of delta group 14. Range C (120° to 150°, always in relation to the R-wave), $U_1 = U_T + U_S$ on account of concurrent paritcipation of the delta groups 14 and 16. Range D (remainder of the R-half-wave), $U_1 = (-U_R) + (U_T)/(2) = U_T$. This then results in the segmentized voltage contour for $U_1$, as depicted in FIG. 6e; and FIGS. 6b, 6c, and 6d show the different conditions prevailing throughout this segmentized period.

Column 2 in FIG. 6 shows the supplemental operation of the star group, the delta group elements being fired as before with a 60-degree phase delay from the respective voltage zero-crossing. The elements of the star group are fired in pairs and toward the end of each voltage half-wave. This will result in current peaks which are algebraically added to the current flow through each delta element close to the center of each interphase of the half-wave contour as established (see rows No. 2, 3, and 4 in column 2).

The operating voltages for the star group elements are, of course, the interface voltages. Specifically elements 31 and 32+ are fired a few degrees ahead of the zero-crossing of the voltage between phases R and S; elements 31− and 33+ are fired a few degrees ahead of a zero-crossing of the RT-interphase voltage; elements 32− and 33− are fired a few degrees ahead of a zero-crossing of the ST-interphase voltage, etc.

As a consequence, the load current is augmented; and one can see from column 2, row 1, that a current peak is added as a trailing end current sequent to the existing current half-wave. An additional (earlier) current peak appears a little after the midway point; but they are preceded by two small current drops. In other words, the combined delta star operation provides for a slightly current redistribution.

FIG. 6f demonstrates the situation in which a pair of star elements is fired (e.g., star elements 31− and 33+) while delta element 15− is conductive. The current through the first star elements passes also through the delta element 15− and is, thus, subtracted from the load current at an inverted peak of smaller or greater magnitude, depending upon the firing angle of the star elements.

FIG. 6g illustrates the effect of firing star elements 32− and 33+ while 14+ is conductive. The resulting current peak in this instance is added to the current in element 14+ and is, thus, added to the load current.

Column 3 in FIG. 6 now demonstrates the situation when the firing delay of the star group elements is advanced for occurring earlier; and column 4 shows that, upon further advancing the firing point (30° in relation to column 3) of the star group elements, the current blocks from the delta group are diminished. This is particularly so at any given point in time, when a particular delta element is conductive; and when a star element is fired, having its anode (or cathode) connected to the anode (or cathode) of the conducting delta element, then the current commutates from that delta element to the star element. If therefore, pursuant to control of the relative firing angle of the star elements are advanced, commutation from the respective delta elements occurs earlier. The participation of the delta elements diminishes accordingly.

This situation of commutation is depicted in FIG. 6h. It is assumed that delta elements 14+ and 16− are conductive; and it is further assumed that star elements are to be fired earlier than as per column 2 but a little later than in column 3, that is, somewhere in the range of from 120° to 150° in relation to the $U_R$-wave. As star elements 31+ and 32− are fired, the current commutates to them from 14+; element 16− remains unaffected, except that the resulting load current peak is applied to the load through that element. $U_T + U_S$ is the driving voltage for 31+ and 32− as per FIG. 6hh.

For shorter delays of firing (FIG. 6j) the star elements, such as between 60° and 120° in $U_R$ (considering the same elements) and corresponding to a situation between column 3 and 4, the delta operation finds element 14+ conductive (the only one of the delta elements); but star elements 32− and 33+ are also (still) conductive at this point. Now, element 31− is fired, and a circuit exists in which the voltage $U_T$ extinguishes the delta element 14+ (FIG. 6jj), and the star element 33+ will extinguish shortly upon the next zero-crossing of its driving voltage.

It can readily be seen that shifting the firing angle for the star elements 31, 32, etc., permits graduated change from one type of operation to the next. One may always fire the delta elements (14, etc.) by approximately 30° or 60° after the respective zero-crossing to, thereby, avoid any short circuit. Changeover of current flow from one phase to another is not affected by the type of commutation as described.

This shift of the firing angle for the star elements, being a reduction in the firing delay as per each half-wave, may be continued until, for full star connection operation, the firing pulse of elements 31 (32, 33) occur right at the zero-crossing of the R-wave (S-wave, T-wave). On the other hand, the firing of the delta circuit elements can be delayed more and more, quite independently from the advance of the star elements as described. This independent shifting of the firing pulses of delta and star elements permits further adaption to the requirements of nonohmic loads. It can readily be seen that in between states can be established on each type of circuit as well as almost-full delta or almost-star connections.

Figure 7:
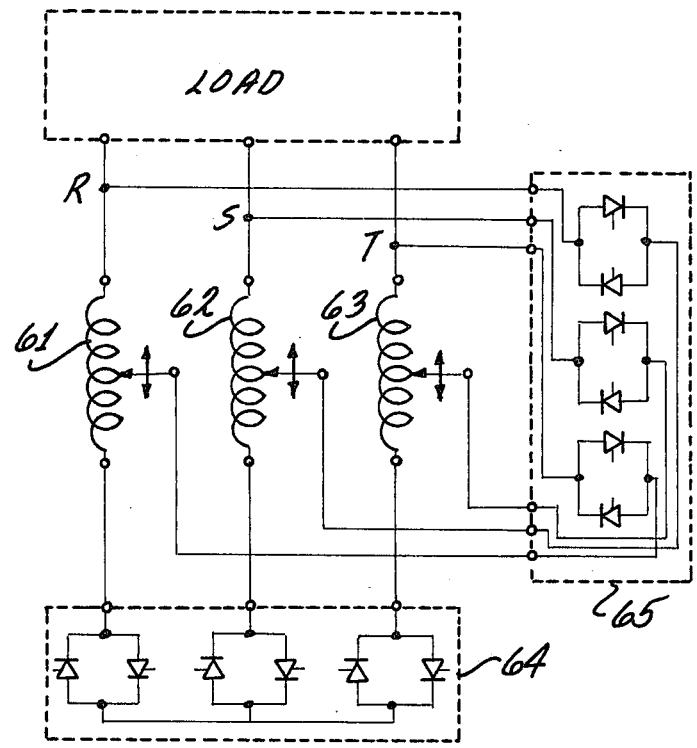
FIG. 7 is a circuit diagram illustrating another application of the invention to transformer secondaries.

Turning now to FIG. 7, the particular example shown here includes three secondaries 61, 62, and 63 of a voltage supply transformer. Each secondary has a tap, possibly an adustable one, and each is serially connected to one element of a three-phase load. The load impedances themselves are assumed to be permanently connected in the delta- or star-circuit configuration; the invention is presently applied to the connection of the secondaries of the supply transformer. A group 64 of semiconductor elements provides for a full star circuit under utilization of the complete extension of each winding. A circuit analogous to FIG. 3 has been assumed, but circuits as per FIGS. 2 or 4 can be employed as well. A second group 65 of semiconductor elements is connected to taps on these windings to establish a delta circuit of parts of the secondaries. The semiconductor elements of this group 65 are always nearly or fully controlled for firing early in the respective cycle.

Figure 8:
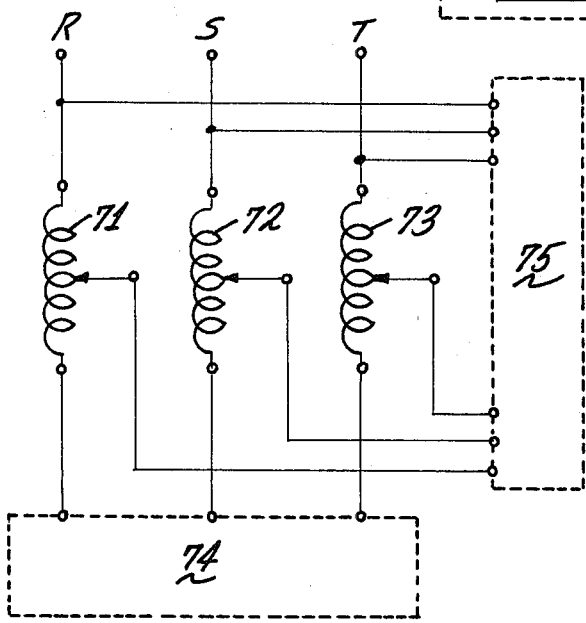
FIG. 8 is a circuit diagram illustrating the application of the invention to transformer primaries.

FIG. 8 illustrates three primary windings 71, 72 and 73 of a load transformer which are directly connected to the power lines R, S, T and have their respective other ends in each instance connected to a circuit 74 which again may by any of the circuits of FIGS. 2, 3, and 4. A second group of semiconductor elements 75 may be configured similar to group 65 in FIG. 7 and is connected to taps on these primaries. Conceivably also, these taps are adjustable to permit full utilization of each primary winding. The group 75 is also controlled for near- or complete maximum conduction.

The invention is not limited to the embodiments described above; but all changes and modifications thereof, not constituting departures from the spirit and scope of the invention, are intended to be included.

I claim:

1. A circuit for the selective connection of a three-phase load in a delta and a star circuit connection, comprising:
   a first group of controllable semiconductor elements connected to said three-phase load for completing a delta circuit for the three-phase load;
   a second group of controllable semiconductor elements connected to ends of the three-phase load for completing a star circuit for the three-phase load; and
   control circuit means connected to the elements of said first and second groups and providing firing pulses to said elements for always operating both of said groups but with different firing delays.

2. A circuit as in claim 1, said first group including three pairs of semiconductor elements, the elements of each pair being connected in phase opposition.

3. A circuit as in claim 1 or 2, said second group including six semiconductor elements, all having one terminal connected to a common junction.

4. A circuit as in claim 1 or 2, said second group including three pairs of semiconductor elements interconnected in a delta circuit.

5. A circuit as in claim 1 or 2, said second group including two subgroups of elements, establishing a three-phase, full-wave rectifier whose d.c. terminals are interconnected by an inductance.

6. A circuit as in claim 1 or 2, wherein said load includes a transformer having primary windings with taps, said first group being connected to the taps.

7. A circuit as in claim 1 or 2, wherein said load includes a transformer having secondary windings with taps, said first group being connected to the taps.

* * * * *